United States Patent
Hansen et al.

(10) Patent No.: US 11,218,026 B1
(45) Date of Patent: Jan. 4, 2022

(54) ZERO-CROSSING CURRENT DETECTION FOR MODULAR AND ROBUST DYNAMIC WIRELESS POWER TRANSFER

(71) Applicants: Matthew J Hansen, Providence, UT (US); Regan A Zane, Hyde Park, UT (US); Abhilash Kamineni, North Logan, UT (US)

(72) Inventors: Matthew J Hansen, Providence, UT (US); Regan A Zane, Hyde Park, UT (US); Abhilash Kamineni, North Logan, UT (US)

(73) Assignee: Utah State University, Logan, UT (US)

( * ) Notice: Subject to any disclaimer, the term of this patent is extended or adjusted under 35 U.S.C. 154(b) by 0 days.

(21) Appl. No.: 17/024,271

(22) Filed: Sep. 17, 2020

(51) Int. Cl.
| | | |
|---|---|---|
| H02J 50/12 | (2016.01) | |
| H02M 7/5387 | (2007.01) | |
| G01R 19/175 | (2006.01) | |
| B60L 53/12 | (2019.01) | |
| H03H 7/01 | (2006.01) | |
| H03H 7/12 | (2006.01) | |
| G01R 19/165 | (2006.01) | |
| H02M 1/00 | (2006.01) | |

(52) U.S. Cl.
CPC ............ H02J 50/12 (2016.02); B60L 53/12 (2019.02); G01R 19/16538 (2013.01); G01R 19/175 (2013.01); H02M 7/53871 (2013.01); H03H 7/12 (2013.01); H03H 7/1741 (2013.01); H02M 1/0009 (2021.05)

(58) Field of Classification Search
CPC .......... H02M 3/158; H02M 3/22; H02M 3/24; H02M 7/53871; H02J 50/10; H02J 50/12; H02J 7/025; B60L 53/12; H03H 7/12; H03H 7/1741
See application file for complete search history.

(56) References Cited

U.S. PATENT DOCUMENTS 10,804,807 B2 * 10/2020 Saha ................. H02M 3/33576

OTHER PUBLICATIONS

Udaya K. Madawala et al., A Bidirectional Inductive Power Interface for Electric Vehicles in V2G Systems, IEEE Transactions on Industrial Electronics, vol. 58, No. 10, Oct. 2011, pp. 1-8.
(Continued)

*Primary Examiner* — Hai L Nguyen

(57) ABSTRACT

An inverter for wireless power transfer includes a primary inverter connected in series with a first primary inductor. A first primary capacitor is connected in parallel with the first primary inductor and primary inverter. A series-connected second primary capacitor and primary pad inductor are in parallel with the second primary capacitor. The synchronous inverter includes a controller configured to detect a first primary current in the first primary inductor to control switches in the primary inverter to provide a positive primary inverter voltage across the output of the primary inverter in response to detecting a positive first primary current, and control the switches in the primary inverter to provide a negative primary inverter voltage across the output of the primary inverter in response to detecting a negative first primary current.

20 Claims, 6 Drawing Sheets

(56) References Cited

OTHER PUBLICATIONS

Ahmed N. Azad et al., Analysis, Optimization, and Demonstration of a Vehicular Detection System Intended for Dynamic Wireless Charging Applications, IEEE Transactions on Transportation Electrification, vol. 5, No. 1, Mar. 2019, pp. 1-15.

Salman Ahmed, Mohammad A. Hoque et al., Demo: Real-time Vehicle Movement Tracking on Android Devices through Bluetooth Communication with DSRC Devices, 2016 IEEE Vehicular Networking Conference (VNC), Dec. 8-10, 2016, pp. 1-2.

Giuseppe Buja et al., Design and Experimentation of WPT Charger for Electric City Car, IEEE Transactions on Industrial Electronics, vol. 62, No. 12, Dec. 2015, pp. 1-12.

Qijun Deng et al., Edge Position Detection of On-line Charged Vehicles With Segmental Wireless Power Supply, IEEE Transactions on Vehicular Technology, vol. 66, No. 5, May 2017, pp. 1-12.

Pakorn Sukprasert, et al., Estimation of Lateral Displacement of Electric Vehicle to an Alignment of Wireless Power Transmitters, Proceedings of the 2014 IEEE/SICE International Symposium on System Integration, Chuo University, Tokyo, Japan, Dec. 13-15, 2014, pp. 1-6.

Abhilash Kamineni et al., Interoperable EV Detection for Dynamic Wireless Charging With Existing Hardware and Free Resonance, IEEE Transactions On Transportation Electrification, vol. 3, No. 2, Jun. 2017, pp. 1-10.

Benedikt Sanftl et al., Reliabe Data Link for Power Transfer Control in an Inductive Charging System for Electric Vehicles, 2016 IEEE MTT-S International Conference on Microwaves for Intelligent Mobility (ICMIM), May 19-20, 2016, pp. 1-3.

Oscar Yu et al., Sequential Parallel Switching for Drain-Source Synchronous Rectifier Efficiency and Light-Load Stability Improvement, 2019 IEEE Applied Power Electronics Conference and Exposition (APEC), Mar. 17-21, 2019, pp. 1-5.

Oscar Yu et al., Synchronous Rectifier Design Considerations for Solid-State Transformer Light-Load Stability, 2018 Asian Conference on Energy, Power and Transportation Electrification (ACEPT), Oct. 30-Nov. 2, 2018, pp. 1-5.

Yuuji Sakayanagi et al., Wireless Power Transmission for a Traveling Mobility Scooter, 2016 International Symposium on Antennas and Propagation (ISAP), Oct. 24-28, 2016, pp. 1-3.

* cited by examiner

ZERO-CROSSING CURRENT DETECTION FOR MODULAR AND ROBUST DYNAMIC WIRELESS POWER TRANSFER

FIELD

This invention relates to wireless power transfer and more particularly relates to zero-crossing current detection for modular and robust dynamic wireless power transfer.

BACKGROUND

In-road primary coils in a wireless power transfer system can detect an approaching vehicle-mounted secondary coil both with dedicated detection hardware and without dedicated detection hardware. Other systems include a vehicle-roadway communication link with no external hardware. However, information necessary for control of the dual-active system is contained in a single current in the wireless power transfer ("WPT") system. In such a system, synchronization signals to communicate with vehicles and fixed WPT pads is complex. Synchronous WPT systems with active inverters in the primary and secondary networks are difficult to control due to instabilities inherent in such systems. More specifically, synchronous inversion systems, which are not in current use, are difficult to control, due to instabilities. WPT systems with active rectification, which are or could be used now, are not exactly unstable but do need synchronization and detection.

SUMMARY

A synchronous inverter for zero-crossing current detection for dynamic wireless power transfer is disclosed. Another synchronous inverter and system also perform the functions of the synchronous inverter. The synchronous inverter includes a primary inverter comprising switches, a first primary inductor connected in series an output of the primary inverter, a first primary capacitor connected in parallel with the first primary inductor and the primary inverter, a second primary capacitor, a primary pad connected in series with the second primary capacitor, where the primary pad includes a primary pad inductance and where the second primary capacitor and primary pad are connected in parallel with the first primary capacitor, and a controller. The primary pad wirelessly transmits power to a synchronous secondary inverter. The controller is configured to detect a first primary current that includes a current in the first primary inductor. The controller controls switches in the primary inverter to provide a positive primary inverter voltage across the output of the primary inverter in response to detecting a positive first primary current, and controls the switches in the primary inverter to provide a negative primary inverter voltage across the output of the primary inverter in response to detecting a negative first primary current.

A synchronous inverter for zero-crossing current detection for dynamic wireless power transfer includes a primary inverter that includes switches that operate at an inverter switching frequency and a reactive component network. The reactive component network includes a first primary inductor connected in series an output of the primary inverter, a first primary capacitor connected in parallel with the first primary inductor and the primary inverter, a second primary capacitor, a primary pad connected in series with the second primary capacitor, where the primary pad includes a primary pad inductance and where the second primary capacitor and primary pad are connected in parallel with the first primary capacitor.

The primary pad wirelessly transmits power to a synchronous secondary inverter. The synchronous inverter includes a controller. The controller includes a switching enable circuit that starts switching of switches of the primary inverter in response to a first primary current of the first primary inductor being above a primary current threshold and disables switching of the switches of the primary inverter in response to the first primary current being below the primary current threshold. The controller includes a primary current filter with an input that is a signal representative of the first primary current. The output of the primary current filter controls switches in the primary inverter to provide a positive primary inverter voltage across the output of the primary inverter in response to the output of the primary current filter having a polarity indicative of a positive first primary current and the output of the primary current filter controls switches in the primary inverter to provide a negative primary inverter voltage across the output of the primary inverter in response to the output of the primary current filter having a polarity indicative of a negative first primary current.

A system for zero-crossing current detection for dynamic wireless power transfer includes a primary inverter with switches, a first primary inductor connected in series with an output of the primary inverter, a first primary capacitor connected in parallel with the first primary inductor and the primary inverter, a second primary capacitor, a primary pad connected in series with the second primary capacitor, where the primary pad includes a primary pad inductance and where the second primary capacitor and primary pad are connected in parallel with the first primary capacitor, and a controller. The controller is configured to detect a first primary current that includes a current in the first primary inductor, control switches in the primary inverter to provide a positive primary inverter voltage across the output of the primary inverter in response to detecting a positive first primary current, and control the switches in the primary inverter to provide a negative primary inverter voltage across the output of the primary inverter in response to detecting a negative first primary current. The system includes synchronous secondary inverter. The primary pad wirelessly transmits power to a secondary pad of a synchronous secondary inverter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
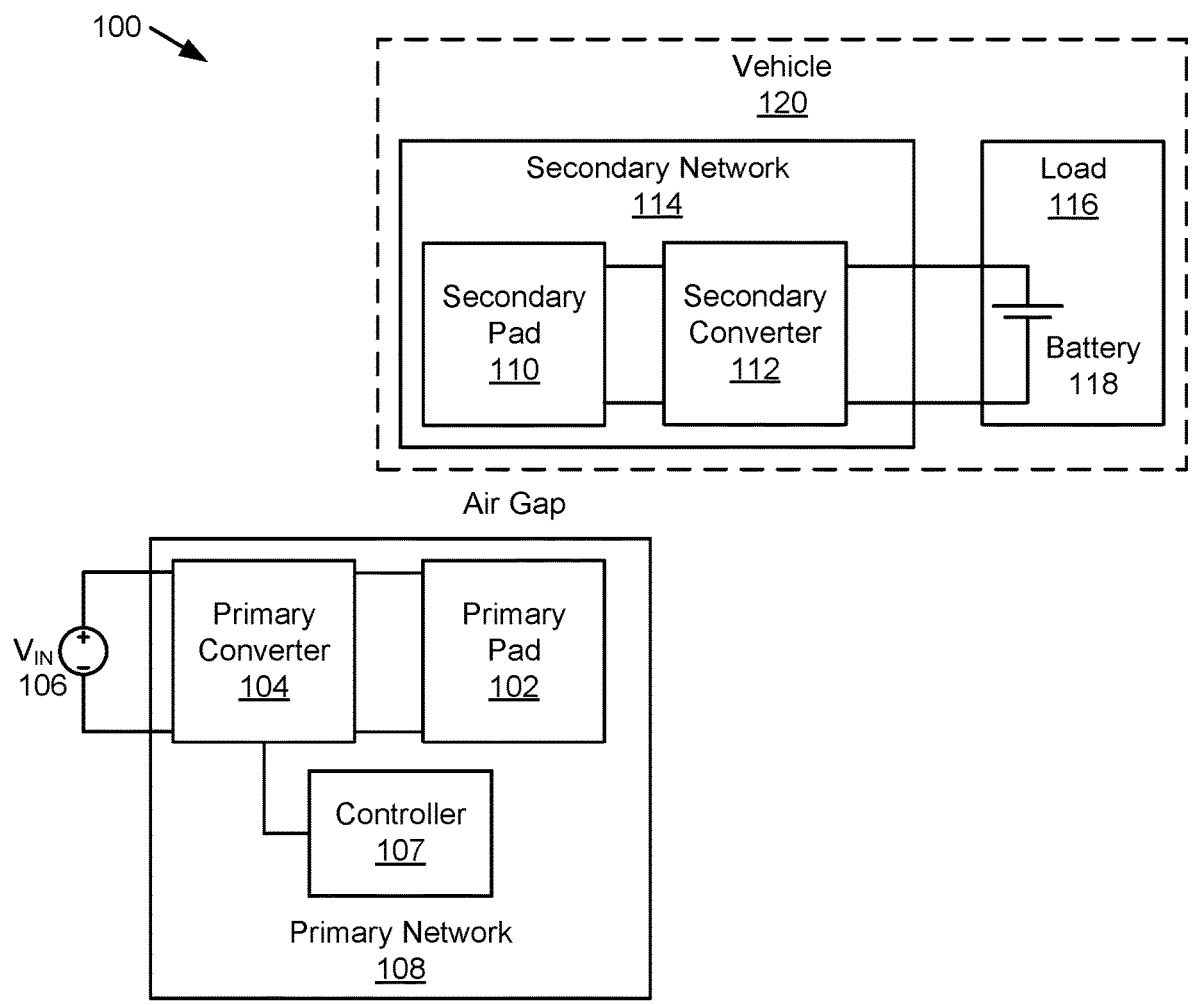
FIG. 1 a schematic block diagram illustrating one embodiment of a system for wireless power transfer.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, circuits, controllers, etc. in order to more particularly emphasize their implementation independence. For example, a module, circuit, controller, etc. may be implemented as a hardware circuit comprising custom VLSI circuits or gate arrays, off-the-shelf semiconductors such as logic chips, transistors, or other discrete components. A module, circuit, controller, etc. may also be implemented in programmable hardware devices such as field programmable gate arrays, programmable array logic, programmable logic devices or the like.

Modules, controllers, etc. may also be implemented partially in software for execution by various types of processors. An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions for carrying out operations of the present invention may be assembler instructions, instruction-set-architecture ("ISA") instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider). In some embodiments, electronic circuitry including, for example, programmable logic circuitry, field-programmable gate arrays ("FPGA"), or programmable logic arrays ("PLA") may execute the computer readable program instructions by utilizing state information of the computer readable program instructions to personalize the electronic circuitry, in order to perform aspects of the present invention.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of includes one and only one of any single item in the list. For example, "one of A, B and C" includes only A, only B or only C and excludes combinations of A, B and C. As used herein, "a member selected from the group consisting of A, B, and C," includes one and only one of A, B, or C, and excludes combinations of A, B, and C." As used herein, "a member selected from the group consisting of A, B, and C and combinations thereof" includes only A, only B, only C, a combination of A and B, a combination of B and C, a combination of A and C or a combination of A, B and C.

A synchronous inverter for zero-crossing current detection for dynamic wireless power transfer is disclosed. Another synchronous inverter and system also perform the functions of the synchronous inverter. The synchronous inverter includes a primary inverter comprising switches, a first primary inductor connected in series an output of the primary inverter, a first primary capacitor connected in parallel with the first primary inductor and the primary inverter, a second primary capacitor, a primary pad connected in series with the second primary capacitor, where the primary pad includes a primary pad inductance and where the second primary capacitor and primary pad are connected in parallel with the first primary capacitor, and a controller. The primary pad wirelessly transmits power to a synchronous secondary inverter. The controller is configured to detect a first primary current that includes a current in the first primary inductor. The controller controls switches in the primary inverter to provide a positive primary inverter voltage across the output of the primary inverter in response to detecting a positive first primary current, and controls the switches in the primary inverter to provide a negative primary inverter voltage across the output of the primary inverter in response to detecting a negative first primary current.

In some embodiments, the controller includes a primary current filter with an input that is a signal representative of the first primary current. The controller controls the switches to provide the positive and negative primary inverter voltages based on a polarity of an output of the primary current filter. In other embodiments, the primary current filter is a fourth order filter. In other embodiments, the controller controls the switches of the primary inverter to provide the positive primary inverter voltage in response to the primary current filter having a first polarity and the controller controls the switches of the primary inverter to provide the negative primary inverter voltage in response to the primary current filter having a second polarity. The first polarity is opposite the second polarity. In other embodiments, the primary inverter switches at an inverter switching frequency and components of the primary current filter are selected such that the output of the primary current filter is substantially in phase with the first primary current at the inverter switching frequency and the output of the primary current filter is at least 90 degrees out of phase with the first primary current at a primary resonant frequency from a resonance formed by the first primary inductor, the first primary capacitor, the second primary capacitor and the primary pad.

In some embodiments, the controller includes a switching enable circuit that starts switching of switches of the primary inverter in response to the first primary current being above a primary current threshold and disables switching of the switches of the primary inverter in response to the first primary current being below the primary current threshold. In other embodiments, the primary inverter switches at an inverter switching frequency and the switching enable circuit includes a band-pass filter and an output of the band-pass filter enables and disables switching of the switches in the primary inverter and the band-pass filter passes a first primary current signal at the inverter switching frequency and excludes a frequency where a phase of an output of a primary current filter that is filtering a first primary current signal matches a phase of an impedance of the first primary inductor, the first primary capacitor, the second primary capacitor and primary pad from the output of the primary inverter. In other embodiments, the band-pass filter comprises a digital filter. In other embodiments, the band-pass filter includes a first digital filter function multiplied by a sine function squared and summed with a second digital filter function multiplied by a cosine function squared.

In some embodiments, the primary inverter switches at an inverter switching frequency and, at the inverter switching frequency, a magnitude of impedance of the first primary inductor equals a magnitude of impedance of the first primary capacitor and equals a magnitude of impedance of the primary pad minus a magnitude of impedance of the second primary capacitor. In other embodiments, the synchronous secondary inverter switches at the inverter switching frequency and includes a first secondary inductor, a first secondary capacitor, a second secondary capacitor and a secondary pad impedance connected a same way as the first primary inductor, the first primary capacitor, the second primary capacitor and the primary pad impedance. At the inverter switching frequency, an impedance of the first secondary inductor equals an impedance of the first secondary capacitor and equals an impedance of the secondary pad minus an impedance of the second secondary capacitor.

In some embodiments, a first connection of the first primary inductor is connected to the output of the primary inverter, a first connection of the first primary capacitor is connected to a second connection of the first primary inductor and a second connection of the first primary capacitor is connected to a common output of the primary inverter, a first connection of the second primary capacitor is connected to the second connection of the first primary inductor, a first connection of the primary pad is connected to a second connection of the second primary capacitor and a second connection of the primary pad is connected to the common output of the primary inverter. In other embodiments, the primary inverter is configured as an H-bridge with an input connected to a direct current ("DC") bus. In other embodiments, an input of the primary inverter is connected to a DC bus and the synchronous inverter includes a rectifier that receives power from an alternating current ("AC") source and provides a DC voltage at the DC bus.

A synchronous inverter for zero-crossing current detection for dynamic wireless power transfer includes a primary inverter that includes switches that operate at an inverter switching frequency and a reactive component network. The reactive component network includes a first primary inductor connected in series an output of the primary inverter, a first primary capacitor connected in parallel with the first primary inductor and the primary inverter, a second primary capacitor, a primary pad connected in series with the second primary capacitor, where the primary pad includes a primary pad inductance and where the second primary capacitor and primary pad are connected in parallel with the first primary capacitor.

The primary pad wirelessly transmits power to a synchronous secondary inverter. The synchronous inverter includes a controller. The controller includes a switching enable circuit that starts switching of switches of the primary inverter in response to a first primary current of the first primary inductor being above a primary current threshold and disables switching of the switches of the primary inverter in response to the first primary current being below the primary current threshold. The controller includes a primary current filter with an input that is a signal representative of the first primary current. The output of the primary current filter controls switches in the primary inverter to provide a positive primary inverter voltage across the output of the primary inverter in response to the output of the primary current filter having a polarity indicative of a positive first primary current and the output of the primary current filter controls switches in the primary inverter to provide a negative primary inverter voltage across the output of the primary inverter in response to the output of the primary current filter having a polarity indicative of a negative first primary current.

In some embodiments, the primary current filter is a fourth order filter. In other embodiments, components of the primary current filter are selected such that the output of the primary current filter is substantially in phase with the first primary current at the inverter switching frequency and the output of the primary current filter is at least 90 degrees out of phase with the first primary current at a primary resonant frequency for a resonance formed by the first primary inductor, the first primary capacitor, the second primary capacitor and the primary pad.

In other embodiments, the switching enable circuit includes a band-pass filter and an output of the band-pass filter enables and disables switching of the switches in the primary inverter and the band-pass filter passes a first primary current signal at the inverter switching frequency and excludes a frequency where a phase of an output of a primary current filter that is filtering a first primary current signal matches a phase of an impedance of the first primary inductor, the first primary capacitor, the second primary capacitor and primary pad from the output of the primary inverter. In other embodiments, the primary inverter switches at an inverter switching frequency and, at the inverter switching frequency, a magnitude of impedance of the first primary inductor equals a magnitude of impedance of the first primary capacitor and equals a magnitude of impedance of the primary pad minus a magnitude of impedance of the second primary capacitor.

A system for zero-crossing current detection for dynamic wireless power transfer includes a primary inverter with switches, a first primary inductor connected in series with an output of the primary inverter, a first primary capacitor connected in parallel with the first primary inductor and the primary inverter, a second primary capacitor, a primary pad connected in series with the second primary capacitor, where the primary pad includes a primary pad inductance and where the second primary capacitor and primary pad are connected in parallel with the first primary capacitor, and a controller. The controller is configured to detect a first primary current that includes a current in the first primary inductor, control switches in the primary inverter to provide a positive primary inverter voltage across the output of the primary inverter in response to detecting a positive first primary current, and control the switches in the primary inverter to provide a negative primary inverter voltage across the output of the primary inverter in response to detecting a negative first primary current. The system includes synchronous secondary inverter. The primary pad wirelessly transmits power to a secondary pad of a synchronous secondary inverter.

FIG. 1 a schematic block diagram illustrating one embodiment of a system 100 for wireless power transfer. The WPT system 100 includes a primary pad 102 for wireless power transfer, a primary converter 104 fed by a power source 106, and a controller 107 on a primary network 108, a secondary pad 110 and a secondary converter 112 on a secondary network 114, a load 116, a battery 118 and a vehicle 120, which are described in more detail below.

The primary network 108 is for wireless power transfer and includes synchronous primary and secondary converters 104, 112 and pads 102, 110. The primary pad 102 receives power from a primary converter 104, which provides alternating current ("AC") current and voltage. The primary converter 104 is a switching converter with semiconductor switches, such as insulated-gate bipolar-transistor ("IGBT") switches, metal-oxide semiconductor field-effect transistor ("MOSFET") switches, or the like. The primary converter 104, in some embodiments, converts incoming AC power from a power source 106 to DC and then uses switches configured as an inverter, such as an H-bridge, to generate AC waveforms at a particular switching frequency. The primary converter 104 includes inductors and/or capacitors in addition to a primary inverter with the semiconductor switches. In some embodiments, the primary converter 104 receives DC power from the power source 106. The primary converter 104 and primary pad 102 provide power to the secondary pad 110 and secondary converter 112 as demanded by the secondary converter 112.

The switching in the primary converter 104 is controlled with a controller 107. Typically, the controller 107 adjusts switching to control power to the primary pad 102 using a zero-crossing technique as explained below. In some embodiments, the vehicle 120 is moving during wireless power transfer.

The secondary pad 110 is designed to receive power via wireless power transfer from the primary pad 102 through magnetic coupling. The secondary converter 112 receives power from the secondary pad 110 and processes the power for deliver to the load 116. The secondary converter 112 is an active device that controls power to the load 116 and includes semiconductor switches. In some embodiments, the WPT system 100 is bidirectional and the secondary pad 110 transmits power to the primary pad 102.

In some embodiments, the load 116 includes a battery 118. The battery 118 may be used to provide power to a motor, such as an electric motor of a vehicle 120. In some embodiments, the secondary converter 112 provides power to the battery 118 as well as to other loads, such as a motor. In other embodiments, the secondary pad 110, secondary converter 112 and load 116 are on a mobile device that is not a vehicle. The vehicle 120 may be an automobile, a truck, a motorcycle, a bicycle, a forklift, etc.

Efficient power transfer during wireless power transfer between the primary pad 102 and secondary pad 110 is desirable. The primary pad 102 is shaped to direct electromagnetic flux in a direction of the secondary pad 110. Leakage flux that does not link to the secondary pad 110 is undesirable. For example, leakage flux may result in power loss. In addition, leakage flux is undesirable for safety reasons and most jurisdictions have regulations regarding leakage flux in terms of a maximum magnetic field strength at a particular distance from a magnetic flux source, such as a primary pad 102. Where the secondary pad 110 transmits power, the same principles and regulations apply as for the primary pad 102.

Figure 2:
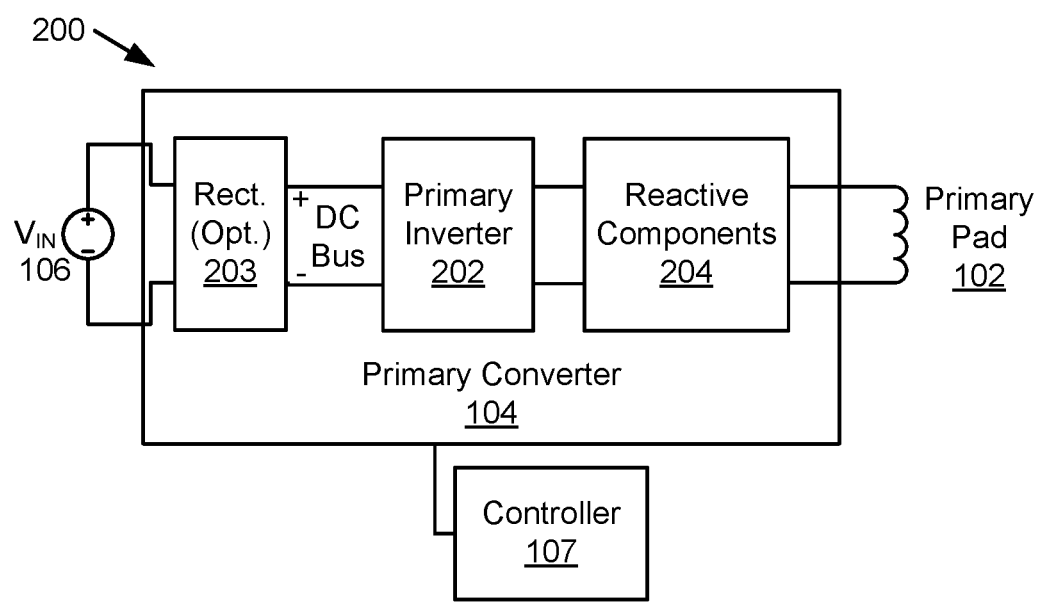
FIG. 2 is a schematic block diagram illustrating one embodiment of a primary WPT system with zero-crossing current detection for wireless power transfer.

FIG. 2 is a schematic block diagram illustrating one embodiment of a primary WPT system 200 with zero-crossing current detection for wireless power transfer. The system 200 includes a primary converter 104 with a primary inverter 202, optionally a rectifier 203 and reactive components 204 where the converter is connected to a primary pad 102. Switching in the primary converter 104 is controlled by a controller 107. Input to the primary inverter 202 is a DC bus. The primary inverter 202, in some embodiments, includes switches to produce a square voltage wave. For example, the primary inverter 202 may be in the form of an H-bridge and at or after the beginning of a cycle the controller 107 closes two switches so that the DC bus is connected with a positive polarity to an output of the primary inverter 202, which is an input to the reactive components 204. At a particular point in time, the controller 107 reverses the switches so that the DC bus is connected to the output of the primary inverter 202 in a negative polarity. The controller 107 may repeat the cycle at an inverter switching frequency. In some embodiments, the inverter switching frequency is 85 kHz. In other embodiments, the inverter switching frequency is a different frequency, and may be in a range from about 10 kHz to about 200 kHz. One of skill in the art will recognize other appropriate switching frequencies.

In some embodiments, the power source 106 is AC and the primary converter 104 includes a rectifier 203 to rectify the AC power to provide DC voltage at the DC bus. In some embodiments, the DC bus includes one or more capacitors. In other embodiments, the power source 106 is a DC source and the primary converter 104 does not include the rectifier 203. In the embodiment, the power source 106 provides DC voltage directly to the DC bus.

Figure 3:
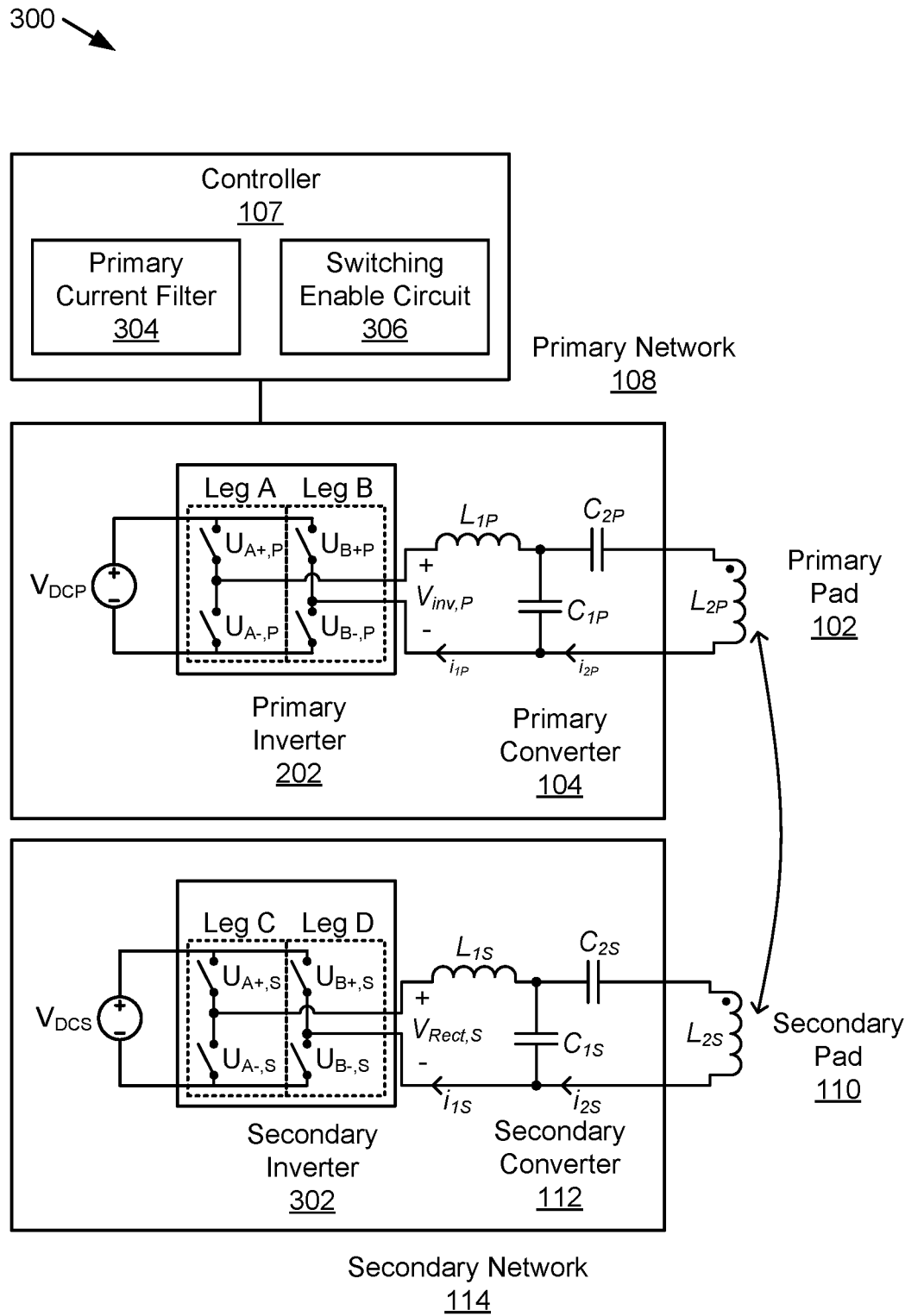
FIG. 3 is a schematic block diagram illustrating a more detailed embodiment of a WPT system with a primary and a secondary with zero-crossing current detection for wireless power transfer.

FIG. 3 is a schematic block diagram illustrating a more detailed embodiment of a WPT system 300 with a primary and a secondary with zero-crossing current detection for wireless power transfer. The WPT system 300 includes a primary network 108 with a primary converter 104 that includes a primary inverter 202 in the form of an H-bridge fed by a DC source $V_{DCP}$, which may be the DC bus of the system 200 of FIG. 2. The primary converter 104 includes reactive components 204 that include a first primary inductor $L_{1P}$, a first primary capacitor $C_{1P}$ and a second primary capacitor $C_{2P}$. The primary pad 102 includes an inductance, which may be called a second primary inductor $L_{2P}$.

The WPT system 300 includes a secondary network 114 with a secondary converter 112 that includes a secondary inverter 302 in the form of an H-bridge fed by a DC source $V_{DCS}$, which may be a battery 118. The secondary converter 112 includes reactive components that include a first secondary inductor $L_{1S}$, a first secondary capacitor $C_{1S}$ and a second secondary capacitor $C_{2S}$. The secondary pad 110 includes an inductance, which may be called a second secondary inductor $L_{2S}$. The primary pad 102 and the secondary pad 110 are loosely coupled with a mutual inductance, which allows for wireless power transfer under certain conditions.

The present approach uses inherent characteristics of WPT current waveforms to replace primary-secondary communication links of other prior art systems. The novel design described herein uses an inductor-capacitor-capacitor-inductor ("LCCL") resonant converter topology shown in FIG. 3, although the approach can be expanded to other topologies as well. The primary network 108 with a primary pad 102 and a primary converter 104 with a primary inverter 202 and the secondary network 114 with a secondary pad 110 and a secondary converter 112 are substantially similar to those described above in relation to the WPT systems 100, 200 of FIGS. 1 and 2.

The secondary H-bridge operates in two modes, as a synchronous rectifier and as an inverter. Before power transfer, the secondary-side H-bridge operates as an inverter, supplying only enough current to counteract parasitic losses. During power transfer, the secondary network 114 operates as a synchronous rectifier at a given frequency. For both modes, the switches operate at a fundamental frequency, $$f_f = \frac{\omega_f}{2\pi}.$$

In some embodiments, the fundamental frequency is the inverter switching frequency. The secondary H-bridge operates as an inverter before engaging with the primary pad 102, energizing the secondary coil $L_{2S}$ of the secondary pad 110. As the secondary network 114 approaches a primary pad 102, the energized secondary coil $L_{2S}$ induces voltages and currents in the primary network 108.

The primary inverter 202 measures current through the inverter; the magnitude of the current determines when a vehicle 120 is approaching. The primary inverter 202 then synchronizes to the $i_{1P}$ and the secondary inverter 302, and begins to send power into the secondary network 114. Both the primary and secondary networks 108, 114 are tuned for the same fundamental frequency $f_f$, which may be the inverter switching frequency. Because the primary inverter output voltage $v_{Inv,P}$ is synchronized to a first primary current $i_{1P}$, the primary H-bridge operates as a "synchronous inverter." A synchronous rectifier tends to pull whatever power is available from a network. Instability associated with synchronous rectification is a well-understood area of active study. In contrast, synchronous inversion has not been developed, as a synchronous inverter would tend to inject power into the network however possible, including at a resonant frequency that is not the inverter switching frequency $f_f$. The embodiments described herein present accommodations necessary to achieve stable operation of synchronous inversion, allowing for modular and robust dynamic WPT.

The secondary side H-bridge maintains the same operation independent of the primary, but when the primary network 108 injects power into the WPT system 100, the secondary H-bridge begins to function as a synchronous rectifier, rather than as an inverter. Although the WPT system 100 is effective with open-loop control of the secondary network 114, the secondary network 114 can also control total power transferred through voltage or phase modulation without additional hardware. After removal of the secondary network 114, the primary-side H-bridge reverts to an idle mode.

The novel embodiments described herein allow for more robust wireless power transfer to in-motion electric vehicles 120. No external synchronization or communication systems are needed, power can be regulated by the vehicle 120, and a total failure of one primary pad does not propagate.

WPT in an LCCL System

The control scheme described herein assumes inductor-capacitor-capacitor ("LCC") compensation on both the primary and secondary networks 108, 114, which are LCCL networks, although the control scheme could be adapted to other topologies as well. One advantage of an LCCL topology is that it allows a voltage-fed system to supply a coil current and an opposite H-bridge current. In some embodiments, the WPT system 100 includes H-bridge switches at a fundamental frequency $f_f$=85 kHz, in line with Society of Automotive Engineers ("SAE") J2954 standards for wireless power transfer for electric vehicles. Again, the scheme is adaptable for a range of component values and an arbitrary fundamental frequency $f_f$.

In a well-tuned LCCL system operating at a fundamental frequency $$f_f = \frac{\omega_f}{2\pi},$$

the magnitude of the impedance of each branch in either the primary network 108 or secondary network 114 is identical, as given in equations (1) and (2). The primary branch impedance is given as $X_P$ and the secondary branch impedance is given as $X_S$. For a given system, $X_P$ is not necessarily equal to $X_S$.

$$\omega_f L_{1P} = \frac{1}{\omega_f C_{1P}} = \omega_f L_{2P} - \frac{1}{\omega_f C_{2P}} = X_P \quad (1)$$

$$\omega_f L_{1S} = \frac{1}{\omega_f C_{1S}} = \omega_f L_{2S} - \frac{1}{\omega_f C_{2S}} = X_S \quad (2)$$

For this analysis, it is useful to refer to currents and voltages as phasors at the fundamental frequency $f_f$. The secondary H-bridge acts as a voltage source at the fundamental frequency $f_f$ on its own secondary network 114. The voltage source $\overline{V}_{Rect,S}$, in series with the first secondary inductor $L_{1S}$ is the Thevenin equivalent of a current source $$\frac{-j\overline{V}_{Rect,S}}{X_S}$$

in parallel with the first secondary inductor $L_{1S}$ and the first secondary capacitor $C_{1S}$, and the branch with the second secondary capacitor $C_{2S}$ and the second secondary inductor $L_{2S}$ in the secondary pad 110. At the fundamental frequency $f_f$, the impedance of the first secondary inductors $L_{1S}$ in parallel with the first secondary capacitor $C_{1S}$ approaches infinity, forcing the Norton equivalent current through the second secondary inductor $L_{2S}$, as shown in equation (3).

$$\overline{I}_{2S} = \frac{-j\overline{V}_{Rect,S}}{X_S} \quad (3)$$

The current $\overline{I}_{2S}$ through second secondary inductor $L_{2S}$ induces a voltage $\overline{V}_{induced}$ at the coil of the primary pad 102, given in equation (4), where $M_{PS}$ is the coupling between the coils of the primary pad 102 and the secondary pad 110. That voltage is modeled in series with the second primary inductor $L_{2P}$ and the second primary capacitor $C_{2P}$, having an impedance of $X_P$. Therefore, $\overline{V}_{induced}$ can be transformed to a Norton current source in parallel with an impedance of $jX_P$ and $-jX_P$. As before, two opposite impedances in parallel have infinite combined impedance, forcing the entire Norton current through the primary inverter 202, as shown in equation (5).

$$\overline{V}_{induced} = \frac{\omega_f M_{PS}(\overline{V})_{Rect,S}}{X_S} \quad (4)$$

$$\overline{I}_{1P} = \frac{j\overline{V}_{induced}}{X_P} = \frac{j\omega_f M_{PS}(\overline{V})_{Rect,S}}{X_S X_P} \quad (5)$$

It can also be shown that at the fundamental frequency $f_f$, even with the reflected impedance of the secondary reactive components, the impedance seen by $\overline{V}_{Inv,P}$ is infinite. Therefore, the primary inverter voltage $\overline{V}_{Inv,P}$ will not contribute to $\overline{I}_{iP}$, making the two quantities independent. Thus, the primary inverter voltage $\overline{V}_{Inv,P}$ is decoupled from the first primary current $\overline{I}_{iP}$. Changing the phase of the primary inverter voltage $\overline{V}_{Inv,P}$ to match the first primary current $\overline{I}_{iP}$ does not affect the first primary current $\overline{I}_{iP}$ and ensures the primary inverter delivers maximum power to the network. The injected power is then absorbed by the secondary.

Some designs use an inductive load to lower switching losses of the semiconductors. Because the primary inverter voltage $\overline{V}_{Inv,P}$ is decoupled from the first primary current $\overline{I}_{iP}$, a leading current can be achieved with a well-tuned system. Therefore, soft switching does not require an inductive load in the designs described herein.

Control Scheme

Several characteristics of the LCCL WPT topology allow for a simplified detection/synchronization scheme through synchronous inversion. The simplified scheme also increases modularity and robustness of the WPT system 100. The embodiments described herein present how detection and synchronization can be accomplished in an ideal, simplified case.

Two full H-bridge inverters (e.g. the primary inverter 202 and the secondary inverter 302) supply both the primary and the secondary pads 102, 110, as shown in FIG. 3. Operation of the primary inverter 202 is dependent on the secondary network 114, while the secondary inverter 302 may be operated with open-loop or closed-loop power regulation. Technology has been developed that would allow a vehicle 120 to detect that primary pads 102 are available with broadcast Global Positioning System ("GPS") or dedicated short-range communications ("DSRC") data. The vehicle 120 may then request power by beginning to switch its own H-bridge in the secondary inverter 302. Power transfer may be regulated on the secondary network 114 with phase modulation, which requires no additional hardware. Other control schemes may also be used to regulate power transfer on the secondary network 114.

The secondary H-bridge forces current Its through the secondary coil, as shown in equation (3). In the absence of a primary pad 102, the secondary inverter 302 sees a purely reactive load, with infinite impedance at the fundamental frequency $f_f$ Typically, only parasitic current passes through the secondary converter 112 while current circulates between the second secondary inductor $L_{2S}$, the second secondary capacitor $C_{2S}$, and the first secondary capacitor $C_{1S}$, maintaining an AC magnetic field near the second secondary inductor $L_{2S}$ in the secondary pad 110. In some embodiments, the secondary H-bridge generates a reference signal for both synchronization and detection and does not need to be synchronized to any other system.

Ideal behavior is dependent on a well-tuned, high-Q-factor system. For a well-tuned system, equations (1) and (2) hold during power transfer. Component values may be chosen for arbitrary design specifications.

In the WPT system 100 described herein, the secondary network 114 typically cannot determine which primary pads 102 are supplying power. The current injected into the battery 118 is determined by the coupling coefficients of the active primary pads 102. Similarly, a given primary pad 102 typically does not have means to determine what other primary pads 102 are active. Current in the primary inverter 202 is affected by coupling with the secondary pad 110 and the current through the secondary pad 110, but not by the operation of other primary pads 102.

Detection

Initially, the primary inverter 202 idles in a passive mode, where $v_{Inv,P}=0$, such as when $U_{A+,P}$ and $U_{B+,P}$ are closed and $U_{A-,P}$ and $U_{B-,P}$ are open. The approaching AC magnetic field from the secondary pad 110 induces a first primary current $i_{1P}$ which flows through the primary inverter 202 as described above, when the WPT system 300 is properly tuned, the first primary current $i_{1P}$ is entirely independent of primary inverter 202 operation at the fundamental frequency $f_f$.

The magnitude of the first primary current $I_{1P}$ can be used to determine when to begin switching the primary inverter 202. The first primary current $I_{1P}$ is proportional to $M_{PS}$ and $$\frac{V_{Rect,S}}{X_S}.$$

It the first primary current $I_{1P} \neq 0$, then $M_{PS} \neq 0$ and $$\frac{V_{Rect,S}}{X_S} \neq 0.$$

When $M_{PS} \neq 0$, power transfer is possible. When $$\frac{V_{Rect,S}}{X_S} \neq 0,$$

the secondary network 114 is requesting power from the primary network 108 by switching the H-bridge of the secondary inverter 302, respectively. Thus, a primary current threshold $I_{1crit,P}$ can be set, such that when $|I_{1P}| > I_{1crit,P}$, the controller 107 of the primary network 108 determines power transfer is both desirable and possible and begins to switch the H-bridge of the primary inverter 202.

In some embodiments, the primary inverter 202 does not change states until the condition shown in equation (6) is met, indicating an approaching vehicle requesting power transfer. In a real-world system, the primary current threshold $I_{1crit,P}$ should be sufficiently high that a neighboring primary pad 102 alone will not cause $I_{1P} > I_{1crit,P}$, which may result in system-level instability. In some embodiments, an arbitrary factor can be used to set the primary current threshold $I_{1crit,P}$, as shown in equation (7), where $V_{DC,P}$ is the maximum primary inverter voltage amplitude, and $M_{PP}$ is a maximum mutual inductance between neighboring primary pads 102. If $\beta<1$, all neighboring primary inverters 102 will begin switching when one primary inverter 202 starts switching. However, a larger $\beta$ causes a larger power step to be injected to the secondary network 114 at primary pad 102 turn-on. Care should also be taken that the condition in equation (8) is met, to ensure that power transfer will indeed occur. If equation (8) is satisfied by a significant margin, the secondary inverter 302 can operate at less than a full duty cycle to minimize parasitic losses until coupling with a primary pad 102 is achieved.

$$I_{1P} > I_{1crit,P} \tag{6}$$

$$I_{1crit,P} = \beta \frac{4V_{DC,P} M_{PP\omega}}{\pi X_{eff,P}^2} \tag{7}$$

$$I_{1crit,P} < \frac{4V_{DC,S} M_{PS\omega}}{\pi X_{eff,P} X_{eff,S}} \tag{8}$$

Synchronization

In some embodiments, the primary inverter 202 switching phase and frequency are controlled by the zero-crossings and direction, but not magnitude, of the first primary current $i_{1P}$. Assuming the spectrum of first primary current $i_{1P}$ is limited to the fundamental frequency $f_f$, synchronization between the zero crossings of the primary inverter voltage $v_{Inv,P}$ and the first primary current $i_{1P}$, in some embodiments, guarantees a 90 degree phase difference between the primary inverter voltage $v_{Inv,P}$ and the secondary inverter voltage $v_{Rect,S}$, leading to maximum power transfer. If the sign of the first primary current $i_{1P}$ equals the sign of the primary inverter voltage $v_{Inv,P}$, the primary network 108 will always act as a source. This is true when the primary inverter voltage $v_{Inv,P}$ and the first primary current $i_{1P}$ follow active sign convention, as described herein.

Essentially, having the first primary current $i_{1P}$ equal the sign of the primary inverter voltage $v_{Inv,P}$ may be called synchronous inversion. Where synchronous rectification matches the signs of the current and voltage using passive sign convention, synchronous inversion matches the signs of the voltage and current using active sign convention. Synchronous inversion injects power into the network. At the fundamental frequency $f_f$, the injected power will be pushed through the secondary network's synchronous rectifier. In the case of WPT for vehicles 120, the roadway inverter (e.g. primary inverter 202) injects power into the primary pad 102, across an air gap, and to the vehicle battery 118.

External synchronization between neighboring primary pads 102 becomes unnecessary, as the synchronization signal is an inherent property of power transfer. Neighboring primary pads 102, in some systems, are be synchronized to help ensure that no primary-primary power transfer occurs. Traditionally, primary pads 102 can be synchronized amongst themselves sending an electrical or optical signal to each primary pad 102. In the present approach, such a primary-primary synchronization signal is not necessary; neighboring primary pads 102 synchronize to the secondary network 114 when present and shut off when there is not secondary pad 110.

At the fundamental frequency $f_f$, power transfer can be controlled on the secondary side by altering a conduction angle $\theta_{CD}$, the angle between leg C and leg D on the secondary inverter 302 of the secondary network 114. Such phase modulation normally equates to a phase shift of $$\frac{\Delta\theta_{CD}}{2}$$

in the secondary network 114. When the primary network 108 and the secondary network 114 are not directly linked, this introduces an additional phase offset between the primary network 108 and the secondary network 114, lowering the power factor of the primary inverter 202 output. However, in the present approach, the primary network 108 synchronizes to the secondary network 114. The phase shift introduced by altering the conduction angle $\theta_{CD}$ is matched by the primary inverter 202, maintaining unity power factor at the primary inverter 202 and secondary inverter 302.

Control Considerations

Control of the primary inverter 202 by detecting only the zero crossings of the first primary current $i_{1P}$, as explained above, may introduce other complexities, which should be remediated to achieve a stable system. Synchronous rectification tends to draw power at whatever frequency is available, dominated by the fundamental frequency of the opposite inverter and generally stable. Synchronous inversion tends to inject power at whatever frequency can be absorbed, which can be dominated by the fundamental frequency of the other inverter or two other frequencies. In order for the WPT system 300 to behave as expected, considerations must be made to ensure injected power is dominated by voltage and current at the fundamental frequency $f_f$ (e.g. inverter switching frequency). Power is injected by the primary network 108 and drawn by the secondary network 114 at the fundamental frequency $f_f$ when the fundamental frequency $f_f$ dominates the spectrum of the primary inverter voltage $v_{Inv,P}$ and the first primary current $i_{1P}$.

The impedance of the primary LCCL network near the fundamental frequency $f_f$ approaches infinity. Without a secondary network 114 injecting current through the primary inverter 202, no frequency near the fundamental frequency $f_f$ will likely dominate the primary inverter voltage $v_{Inv,P}$. However, when a secondary network 114 does induce current the first primary current $i_{1P}$ at the fundamental frequency $f_f$, the fundamental frequency $f_f$ can dominate the spectrum of the primary inverter voltage $v_{Inv,P}$. For the primary network 108, there are two frequencies, $f_{z1}$ and $f_{z2}$, where the impedance seen by the primary inverter voltage $v_{Inv,P}$ is 0. An anti-resonance filter helps to ensure that the fundamental frequency $f_f$ dominates the spectrum on injected power. However, in some designs, the anti-resonance filter introduces another issue, where the apparent power injected by the primary inverter voltage $v_{Inv,P}$ becomes significant, even though real power approaches zero. The condition prevents successful current shut-off and obstructing power flow to the secondary network 114.

The embodiments described herein include considerations for resonant frequency and turn on/off transitions. The solutions to such issues do not require a significantly increased system complexity.

A. Anti-Resonance Filter

Regardless of the component values used in the primary network 108, if ideal components are used, it can be shown that the natural response of the first primary current $i_{1P}$ to some voltage induced on the primary pad coil inductance $L_{coil,P}$ (e.g. the second primary inductor $L_{2P}$) contains two frequencies, $f_{z1}$ and $f_{z2}$, given in equations (9) and (10), where fcoil is given in equation (11). Although an approaching vehicle 120 operates the synchronous rectifier (e.g. the secondary inverter 302) exclusively at 85 kHz, the time-varying nature of the mutual inductance $M_{PS}$ of the primary and secondary pads 102, 110 spreads the spectrum of the induced voltage around the fundamental frequency $f_f$, typically including some energy at the two frequencies $f_{z1}$ or $f_{z2}$. The relationship between the first primary current $i_{1P}$ and the primary inverter voltage $v_{Inv,P}$ is inherently non-linear; however, the primary inverter voltage $v_{Inv,P}$ will likely include energy at least at all the frequencies represented in the first primary current $i_{1P}$.

$$f_{z1} = f_f \sqrt{1 - \sqrt{1 - \frac{f_{coil}^2}{f_f^2}}} \tag{9}$$

$$f_{z1} = f_f \sqrt{1 + \sqrt{1 - \frac{f_{coil}^2}{f_f^2}}} \tag{10}$$

$$f_{coil} = \frac{1}{2\pi \sqrt{L_{2P} C_{2P}}} \tag{11}$$

It can be shown that the impedance seen by the primary inverter 202 at $f_{z1}$ and $f_{z2}$ is zero. If the primary inverter voltage $v_{Inv,P}$ includes a component at $f_{z1}$ or $f_{z2}$, resonance will occur. The component of the primary inverter voltage $v_{Inv,P}$ at $f_{z1}$ or $f_{z2}$ will introduce an ever-increasing current at that frequency. The building current at $f_{z1}$ or $f_{z2}$ will dominate the driven current at 85 kHz, and the primary inverter 202 with zero-crossing control will operate exclusively at $f_{z1}$ or $f_{z2}$. Because the secondary pad uses open-loop synchronous rectification at 85 kHz, not $f_{z1}$ or $f_{z2}$, typically none of the power injected by the primary network 108 will be picked up by the secondary network 114.

One solution is to pass the first primary current $i_{1P}$ through a simple controller G(s) and switch states of the primary inverter 202 on the zero crossings of G($i_{1P}$), rather than the first primary current $i_{1P}$. In one embodiment, the simple controller G(s) is a filter function. Because zero crossings are used, the phase, not the magnitude, of G($j2\pi f$)

is relevant. The filter function G(s) is to have the phase properties shown in equations (12), (13), and (14), where $\angle G(j2\pi f)=\phi_{vi,c}(j2\pi f)$.

$$|\varnothing_{vi,c}(j2\pi f_{z1})|>90° \quad (12)$$

$$|\varnothing_{vi,c}(j2\pi f_{z2})|>90° \quad (13)$$

$$|\varnothing_{vi,c}(j2\pi f_f)|\approx 0° \quad (14)$$

Figure 6:
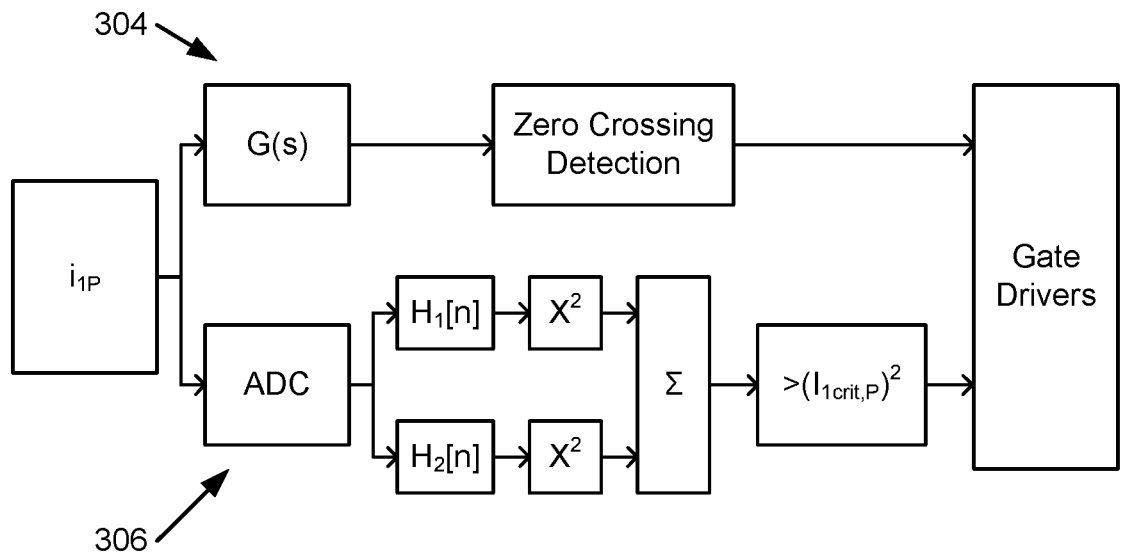
FIG. 6 is a schematic block diagram illustrating a control system overview for zero-crossing current detection for wireless power transfer.

The conditions in equations (12) and (13) ensure that the applied voltage will draw power from the network at $f_{z1}$ and $f_{z2}$, reducing the current at $f_{z1}$ or $f_{z2}$. Alternatively, equation (14) ensures the primary inverter 202 will inject energy into the network at $f_f$, which will be received by the secondary network 114. The equation (14) may be only approximate to allow for soft switching. The small current at $f_{z1}$ or $f_{z2}$ will then remain negligible, the first primary current $i_{1P}$ and the primary inverter voltage $v_{Inv,P}$ will be dominated by the fundamental frequency $f_f$, the inverter will inject maximum power into the system, and the secondary will receive nearly all the power transferred through the primary inverter. FIG. 6 illustrates the described controller. In a given design, $\phi_{vi,c}$ at the fundamental frequency $f_f$ can also be set to some non-zero value to achieve soft switching.

The filter effectively forces the angle of the impedance to be $\angle G(j2\pi f)$. When the angle of the impedance is not enforced by the components; such as at the fundamental frequency $f_f$, $f_{z1}$ and $f_{z2}$, the filter is effective. The effect of the filter on other frequencies is discussed below.

Figure 4:
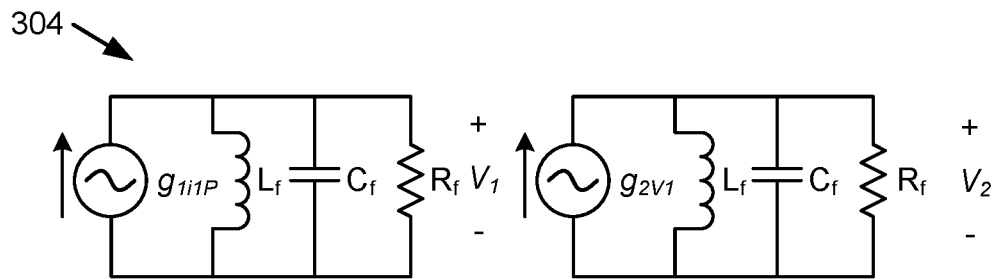
FIG. 4 is a schematic block diagram illustrating a primary current filter for zero-crossing current detection for wireless power transfer.

FIG. 4 is a schematic block diagram illustrating a primary current filter 304 for zero-crossing current detection for wireless power transfer. The primary current filter 304 used in the simulations presented here was a two-stage analog filter, as depicted in FIG. 4. In some embodiments, the primary current filter 304 is a fourth order filter. In some embodiments, an input to primary current filter 304 is a signal representative of the first primary current $i_{1P}$. The controller 107, in some embodiments, controls the switches of the primary inverter 202 to provide positive and negative primary inverter voltages $v_{Inv,P}$ based on a polarity of an output of the primary current filter 304. In some embodiments, the first primary current $i_{1P}$ is passed through a current transformer. In other embodiments, the first primary current $i_{1P}$ is sensed using other sensors, such as measuring voltage across a known resistance, using a hall-effect sensor, etc.

A scaled-down current is injected into a first stage of the primary current filter 304 that, in some embodiments, includes a parallel network of an inductor $L_f$, capacitor $C_f$, and resistor $R_f$. Current through the resistor $R_f$ of the first filter stage is then injected into a second, identical filter stage. In other embodiments, the second stage is not identical to the first state of the primary current filter 304. Since only the phase is important and the current and voltage of a resistor will always be in-phase, voltage $V_1$ across the network and current through the resistor $R_f$ of the first stage of the primary current filter 304 may be used interchangeably and injected into the second stage of the primary current filter 304. For embodiments with a series-connected primary current filter 304, a voltage source may be used, values of the inductor and capacitor are switched, and the value of the resistance is inverted.

For an analog inductance-capacitance-resistance ("LCR") filter, in some embodiments, the inductor and capacitor are tuned to resonate at the fundamental frequency $f_f$. For series or parallel-type primary current filters 304, the minimum quality factor Q is given in equation (15). The factor Q is $$\frac{\omega_f L_f}{R_f}$$

for a series-connected primary current filter 304 and $$\frac{R_f}{\omega_f L_f}$$

for a parallel-connected primary current filter 304.

$$Q > \frac{\sqrt{1+\sqrt{1-\frac{f_{coil}^2}{f_f^2}}}}{\sqrt{1-\frac{f_{coil}^2}{f_f^2}}} \quad (15)$$

In some embodiments, the controller 107 controls the switches of the primary inverter 202 to provide the positive primary inverter voltage $v_{Inv,P}$ in response to the primary current filter 304 output having a first polarity and the controller 107 controls the switches of the primary inverter 202 to provide the negative primary inverter voltage $V_{Inv,P}$ in response to the primary current filter 304 output having a second polarity where the first polarity is opposite the second polarity. In some embodiments, the first polarity is positive value so $V_2$ is a positive voltage and the second polarity is a negative value so $V_2$ is a negative voltage. In other embodiments, the first and second polarities are reversed.

In some embodiments, the primary inverter 202 switches at an inverter switching frequency, which is the fundamental frequency $f_f$, and components $L_f$, $C_f$, $R_r$ of the primary current filter 304 are selected such that the output $V_2$ of the primary current filter 304 is substantially in phase with the first primary current $i_{1P}$ at the inverter switching frequency $f_f$ (e.g. phase shift of zero) and the output $V_2$ of the primary current filter 304 is at least 90 degrees out of phase with the first primary current $i_{1P}$ at a primary resonant frequency $f_{z1}$ or $f_{z2}$ for a resonance formed by the first primary inductor $L_{1P}$, the first primary capacitor $C_{1P}$, the second primary capacitor Cep and the primary pad 102 (e.g. $L_{2P}$). As used herein the output $V_2$ of the primary current filter 304 is substantially in phase with the first primary current $i_{1P}$ at the inverter switching frequency $f_f$ includes being exactly in phase as well as being a few degrees out of phase, such as plus or minus about 5-7 degrees out of phase.

B. Turn On/Turn Off Filter

In some embodiments, the controller 107 includes a switching enable circuit 306 that starts switching of switches of the primary inverter 202 in response to the first primary current $i_{1P}$ being above a primary current threshold $I_{1crit,P}$ and disables switching of the switches of the primary inverter 202 in response to the first primary current $i_{1P}$ being below the primary current threshold $I_{1crit,P}$.

In some embodiments, the switching enable circuit 306 includes a band-pass filter and an output of the band-pass filter enables and disables switching of the switches in the primary inverter 202 and the band-pass filter passes a first primary current signal at the inverter switching frequency $f_f$ and excludes a frequency where a phase of an output of the primary current filter 304 that is filtering the first primary current signal $i_{1P}$ matches a phase of impedance of the first primary inductor $L_{1P}$, the first primary capacitor $C_{1P}$, the second primary capacitor Cep and primary pad 102 (e.g. $L_{2P}$) from the output of the primary inverter 202.

Figure 5:
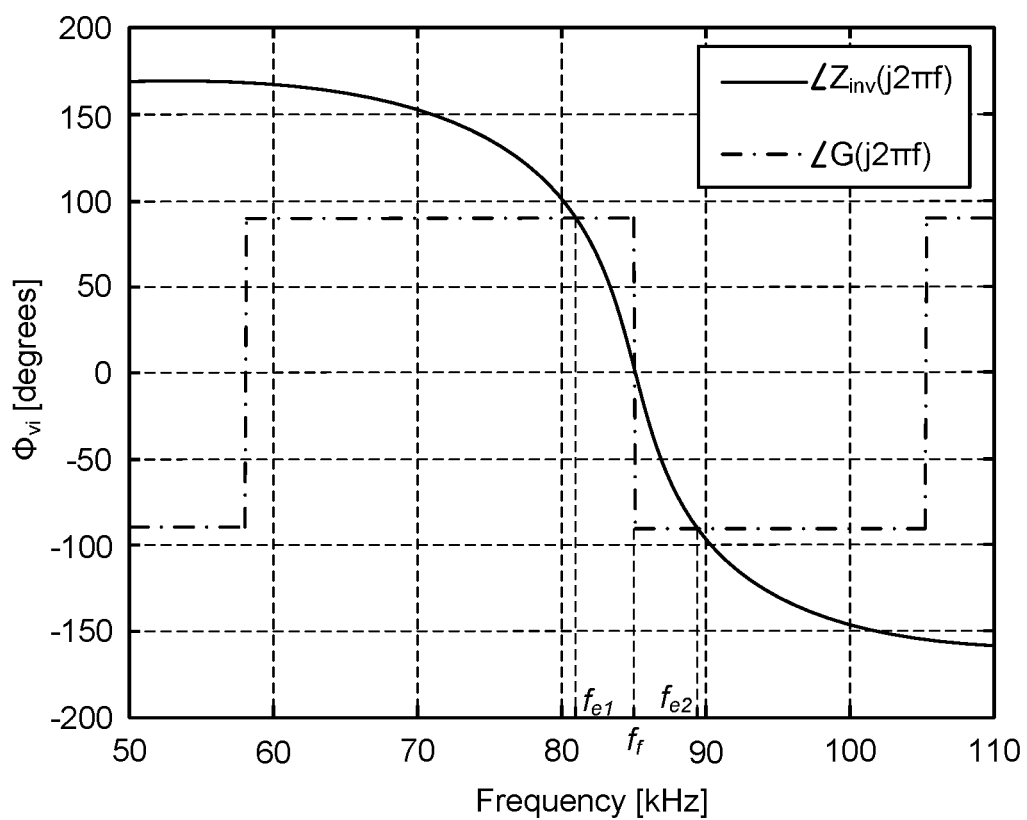
FIG. 5 illustrates interaction of the primary current filter and network impedance of the primary system.

In some embodiments, the filter function $G(j2\pi f)$ defines the phase between the primary inverter voltage $v_{Inv,P}$ and the first primary current $i_{1P}$. However, the phase is also defined as $\angle Z_{inv}(j2\pi f)$ by the network characteristics of the impedance of the first primary inductor $L_{1P}$, the first primary capacitor $C_{1P}$, the second primary capacitor Cep and primary pad 102 (e.g. $L_{2P}$) for most frequencies. Due to the lack of damping elements in the primary network 108, the phase of the impedance seen by the primary inverter 202, when the magnitude of the impedance is neither infinite nor 0, is ±90° (degrees). The phase difference $\phi_{vi}$ defined by both the primary network 108 and filter function $G(j2\pi f)$ is shown in FIG. 5. When the phase of the filter function $\angle G(j2\pi f) < \angle Z_{inv}(j2\pi f)$, the frequency will decrease until a stable point is reached. Similarly, when $\angle G(j2\pi f) > \angle Z_{inv}(j2\pi f)$, the frequency of the primary inverter voltage $v_{Inv,P}$ will increase.

As seen in FIG. 5, when driven only by the primary inverter, the fundamental frequency $f_f$ is an unstable frequency. However, because the primary network impedance at the fundamental frequency $Z_{inv}(j2\pi f_f)$ approaches infinity, the first primary current $i_{1P}$ will be dominated by the contribution of the secondary network 114, as previously discussed. Thus, as long as the secondary network 114 operates consistently at a frequency near the fundamental frequency $f_f$, the frequency of the first primary current will not drift due to mismatch between $\angle G(j2\pi f)$ and $\angle Z_{inv}(j2\pi f)$.

However, in the absence of a first primary current $i_{1P}$ driven by the secondary network 114, the frequency of the primary inverter voltage $v_{Inv,P}$ may tend to drift. When the secondary network 114 no longer induces a first primary current $i_{1P}$ at the fundamental frequency $f_f$, the primary inverter 202 will drift and operate at $f_{e1}$ or $f_{e2}$, the frequencies for which $\angle G(j2\pi f) = \angle Z_{inv}(j2\pi f) = \pm 90°$, given in equations (16) and (17) and depicted in FIG. 5 where $\angle G(j2\pi f)$ and $\angle Z_{inv}(j2\pi f)$ cross. At either of those operating frequencies ($f_{e1}$ or $f_{e2}$), the primary network 108 may consume a large amount of reactive power, and the first primary current $i_{1P}$ will be non-zero, possibly perpetuating operation of the primary inverter 202. Current measurement in the primary network 108 is not guaranteed to function well as both the turn on and turn off trigger if it includes contributions to the current at those frequencies ($f_{e1}$ or $f_{e2}$).

$$f_{e1} = \frac{f_f}{2Q}\left(\sqrt{1+4Q^2} - 1\right) \tag{16}$$

$$f_{e2} = \frac{f_f}{2Q}\left(\sqrt{1+4Q^2} + 1\right) \tag{17}$$

A band-pass filter in the switching enable circuit 306 can be used between the measurement of the first primary current $i_{1P}$ and the measurement of the magnitude of the first primary current $i_{1P}$ to not include contributions to the first primary current $i_{1P}$ from frequencies near $f_{e1}$ and $f_{e2}$.

FIG. 6 is a schematic block diagram illustrating a control system overview for zero-crossing current detection for wireless power transfer. The control system of FIG. 6 includes the primary current filter 304 as a top branch and the switching enable circuit 306 as a bottom branch.

1) General Approach:

Generally, a magnitude filter H(s) must have enough attenuation at $f_{e1}$ and $f_{e2}$ that the conditions in equations (18) and (19) are met. An analog for the switching enable circuit 306 filter typically provides 6 dB of attenuation at $f_{e1}$ and $f_{e2}$ relative to the fundamental frequency $f_f$, meaning that if the condition in equations (20) and (21) are met, the magnitude |G(s)| of the primary current filter 304 can be used to determine turn on/turn off transitions. In that case, both filters 304, 306 and the gate driving signals can be implemented with an analog circuit.

$$|H(j2\pi f_{e1})|\frac{4V_{DC,P}}{\pi|Z_{inv}(J2\pi f_{e1})|} < I_{1,crit} \tag{18}$$

$$|H(j2\pi f_{e2})|\frac{4V_{DC,P}}{\pi|Z_{inv}(J2\pi f_{e2})|} < I_{1,crit} \tag{19}$$

$$\frac{I_{1,crit}|Z_{inv}(J2\pi f_{e1})|}{4V_{DC,P}} > \frac{1}{2} \tag{20}$$

$$\frac{I_{1,crit}|Z_{inv}(J2\pi f_{e2})|}{4V_{DC,P}} > \frac{1}{2} \tag{21}$$

The possibility of such an analog-only filter design is not guaranteed, especially if $V_{DC,P} \approx V_{DC,S}$. If an analog-only turn on/turn off scheme is difficult, a different approach may be used. A digital finite impulse response ("FIR") filter solution may be used in some embodiments.

For the digital FIR filter, the first primary current $i_{1P}$, in some embodiments, is sampled at such a frequency that the fundamental frequency $f_f$ aliases to a discrete-time frequency near 0.25. Aliasing to that frequency ensures that the full magnitude of the signal is represented. Additionally, $f_{e1}$ and $f_{e2}$ should alias near 0 or 0.5.

A low-pass window filter w[n] is chosen in some embodiments. The window filter will have the properties given in equations (22), (23), and (24), where $F_f$, $F_{e1}$, and $F_{e2}$ are the discrete time equivalents of $f_f$, $f_{e1}$, and $f_{e2}$ sampled at $f_s$ on the range 0 to 1.

$$|W(F_F - F_{e1})| < |H(j2\pi f_{e1})| \tag{22}$$

$$|W(F_F - F_{e2})| < |H(j2\pi f_{e2})| \tag{23}$$

$$|W(0)| = 1 \tag{24}$$

Additionally, ensuring that the condition in equation (25) is met eliminates the dependence of the filter system output on the phase of the input signal. This can generally be accomplished when the length l of the filter system times $f_f/f_s$ is an integer.

$$|W(2F_F)| \approx 0 \tag{25}$$

In one embodiment, two filters, h1[n] and h2[n], are used. The sampled current is passed through both filters, squared, and summed, as shown in FIG. 6. When the output is greater than $I^2_{1,crit}$, the primary inverter 202 begins to apply a voltage to the primary network 108. The formulas for h1[n] and h2[n] are given in equations (26) and (27), which transforms the lowpass filter given by the window function into two band-pass filters. The phases of the two filters are orthogonal across the passband of the band-pass filter, so the entire component of the first primary current $i_{1P}$ at the fundamental frequency $f_f$ is represented. In other words, when the square of the summation of h1[n] and h2[n] is greater than $I^2_{1,crit}$, the output of the band-pass filter is positive. In another embodiment, for a single-frequency first primary current $i_{1P}$, where the first primary current $i_{1P}$ is in the passband and the conditions of equations (22), (23) and (24) are met, it can be shown that the output of the band-pass filter is the magnitude of the first primary current $I_{1P}$ or $|i_{1P}|^2=2(h1[n])^2+2(h2[n])^2$. Measuring the band-pass filter output can be used to measure only the magnitude of the current at the given frequency, and the band-pass filter output is independent of the phase of the input.

$$h_1[n]=2\cos(2\pi F_F n)\omega[n] \quad (26)$$

$$h_2[n]=2\sin(2\pi F_F n)\omega[n] \quad (27)$$

In other embodiment, some additional attenuation at $f_{e1}$ and $f_{e2}$ may be achieved by sampling $g(i_{1P})$ rather than the first primary current $i_{1P}$ directly. Because the current transformer and resistances introduce gain, $I_{1crit,P}$ must be appropriately scaled to compensate.

2) Optimized Approach: In other embodiments, under certain conditions, the window function w[n] can be rectangular; w[n]=1/1; 0<=n<1. In such a case, the computational complexity can be significantly reduced. The filters h1[n] and h2[n] could be repeatedly updated with each new sample m, as shown in equations (28) and (29).

$$h_1[n,m] = \frac{2\cos(2\pi F_F(n-m))}{l} \quad (28)$$

$$h_2[n,m] = \frac{2\sin(2\pi F_F(n-m))}{l} \quad (29)$$

Such a change has no effect on the performance of the filter, as the two filters are still orthogonal. However, only one product changes with each new sample. Thus, with sufficient memory, a filter of arbitrary length can be implemented with only 9 operations per new sample.

Results

To validate the theoretical results, the scheme presented here was simulated in a Piecewise Linear Electrical Circuit Simulation ("PLECS")/Simulink® environment. Coupling factors and inductances were gathered from a finite element model of a double-D-shaped coil system. For both test cases, the vehicle was simulated to pass over the primary pads at 100 kilometers per hour ("km/h").

The component values used in the simulations are given in Table I. Two values are given for the coil inductances, because the inductance of the coil depends on the relative position of the primary and secondary coils. The system was designed for 8 kW power transfer. A series resistance of 10 milli-ohms ("mΩ") was included with each inductor to better reflect realizable hardware. The parasitic resistance also served to attenuate harmonics and transients over time, leading to better power transfer performance.

TABLE I

Component Values

| Component | Value | Component | Value |
|---|---|---|---|
| $V_{DC,P}$ | 278 V | $V_{DC,S}$ | 600 V |
| $L_{1P}$ | 40.6 µH | $L_{1S}$ | 40.6 µH |
| $C_{1P}$ | 86.5 nF | $C_{1S}$ | 86.5 nF |
| $C_{2P}$ | 3.455 nF | $C_{2S}$ | 3.455 nF |
| $L_{2P,min}$ | 142 µH | $L_{2S,min}$ | 326 µH |
| $L_{2P,max}$ | 150 µH | $L_{2S,max}$ | 351 µH |

The controller parameters and component values shown in Table I and the chosen parameter yield the values shown in Table II. A Blackman filter of length 40 was used for h1 and h2, given in equations (30) and (31), with the window filter given in equation (32).

TABLE II

Controller Parameters and Components

| Parameter | Value | Parameter | Value |
|---|---|---|---|
| $f_f$ | 85 kHz | $f_{coil}$ | 71.9 kHz |
| $f_{z1}$ | 58.1 kHz | $f_{z2}$ | 105 kHz |
| $L_f$ | 1 µH | $C_f$ | 3.51 µF |
| $Q_{min}$ | 2.32 | Q | 10 |
| $f_{e1}$ | 80.9 kHz | $f_{e2}$ | 89.4 kHz |
| $|Z_{e1}|$ | 12.6 Ω | $|Z_{e2}|$ | 4.98 Ω |
| $I_{e1}$ | 28.0 A | $I_{e2}$ | 71.0 A |
| $X_{eff,P}$ | 21.7 Ω | $M_{PP}$ | 1.70 µH |
| β | 3 | $I_{1crit,P}$ | 1.03 A |
| $f_s$ | 20 kHz | $F_F$ | 0.250 |
| $F_{e1}$ | 0.043 | $F_{e2}$ | 0.468 |

$$h_1[n] = \cos(2\pi 0.25n)\omega[n] \quad (30)$$

$$h_2[n] = \sin(2\pi 0.25n)\omega[n] \quad (31)$$

$$\omega[n] = 0.42 - 0.5\cos\left(\frac{2\pi n}{39}\right) + 0.08\cos\left(\frac{4\pi n}{39}\right) \quad (32)$$

The baseline test simulated standard prior art inverter operation: externally synchronized primary pads and synchronous rectification of the secondary. However, no detection is available; the primary pads operated continuously throughout the test. Additionally, primary-secondary synchronization was hardcoded into the simulation, which is an impractical solution. External synchronization among all the primary pads was also required. Power transfer from each of the four primary pads and to the secondary was observed.

Figure 7:
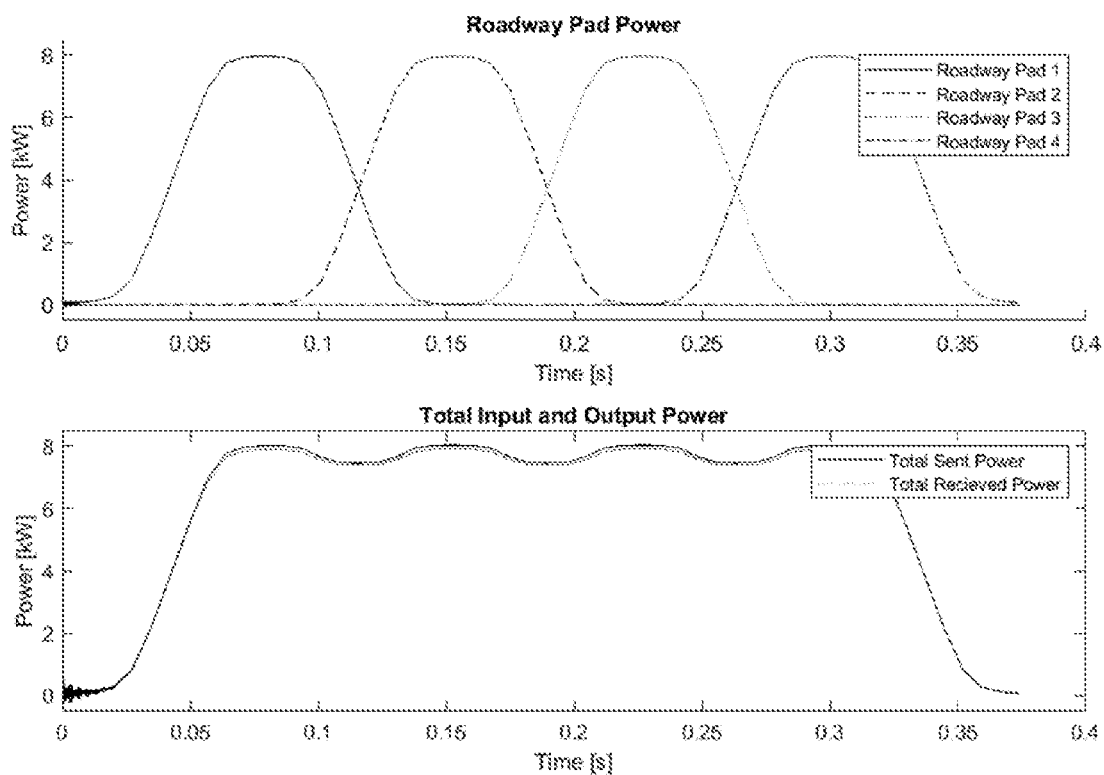
FIG. 7 illustrates simulation results for a control test with passive secondary rectification.

As can be seen in FIG. 7, there are no turn on/off transitions with passive secondary rectification. When the secondary does not induce a first primary current $i_{1P}$, there is no clear signal a vehicle is approaching. Therefore, the primary pads remain on for the duration of the test. Additionally, there is no option for power regulation on the secondary unless an additional DC/DC converter is used. However, the power transfer profile is smooth, as expected from a passive rectification scheme.

The next test employed the synchronous inverter control scheme described herein. The secondary network 114 used open-loop control. Both the primary network 108 and secondary network 114 operated at $\theta_{AB}=\theta_{CD}=180°$. The on/off transitions are clearly seen, and behavior is as expected. Inefficiencies are similar to the existing, passive secondary rectification scenario.

Figure 8:
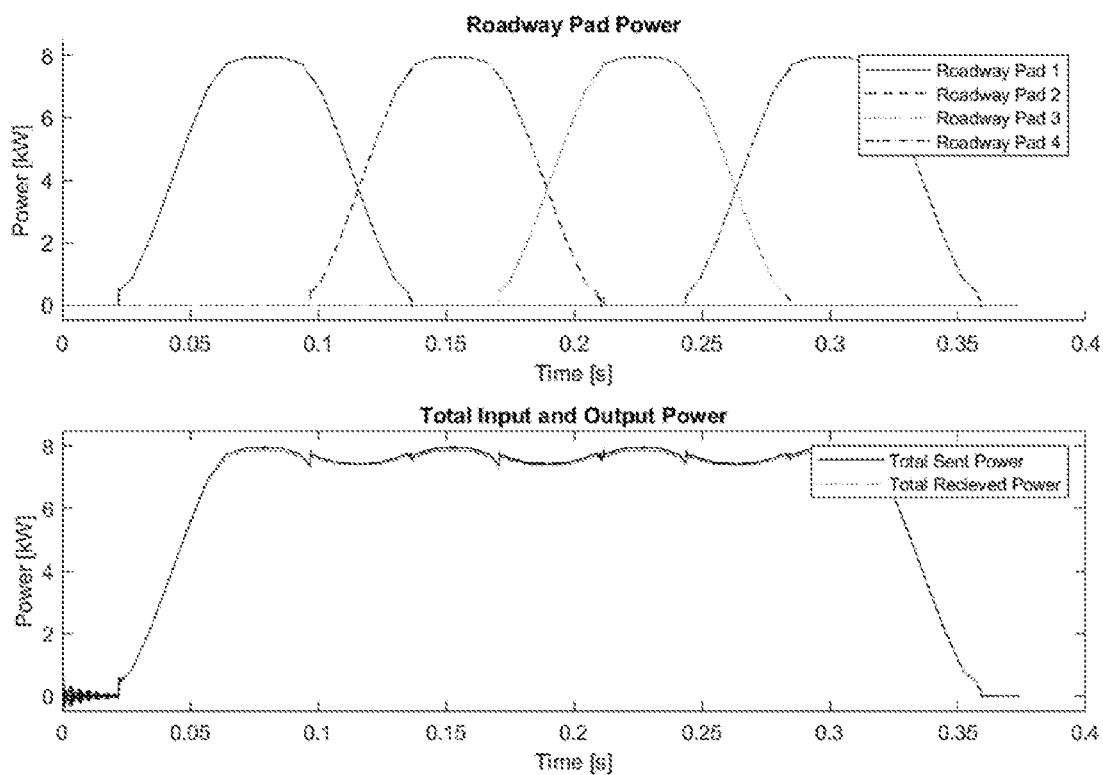
FIG. 8 illustrates simulation results for normal operation of a system zero-crossing current detection for wireless power transfer.

FIG. 8 illustrates normal operation conditions with definite turn on/off transitions. Additionally, there is no external primary-primary or primary-secondary communication or synchronization. The quality of the power transfer is nearly untouched, compared to passive secondary rectification, while achieving the benefits in detection, synchronization, and possibility of secondary power regulation. There is a step function in power transfer at the turn-on of each pad. By the time current had built in the primary to reach the primary current threshold $I_{1crit,P}$, non-zero power could be transferred, resulting in the step function indicated in FIG. 8. The ripple in the first 20 milliseconds ("mS") is due to the secondary network charging up.

The third simulation demonstrates the robustness of the system against phase shifts. A small phase shift could be inevitable with the secondary control scheme. However, the phase shift of the secondary inverter would generally be a small and slow shift. The third simulation altered the phase by 180° instantly during power transfer, transforming the secondary from a power drain into a power source.

Figure 9:
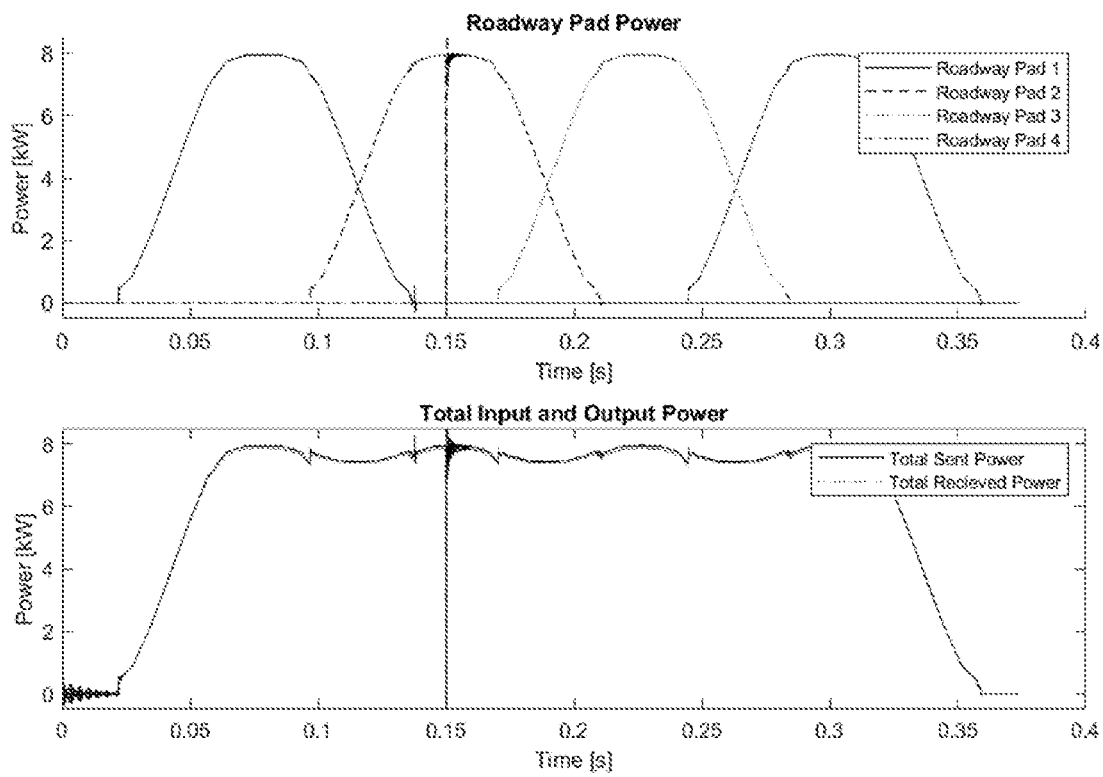
FIG. 9 illustrates simulation results for normal operation of a system zero-crossing current detection for wireless power transfer with an instantaneous 180 degree phase shift.

As can be seen in FIG. 9, the 180° phase shift does interrupt power transfer. However, the primary responds in roughly 1 mS as power transfer returns to pre-phase-shift levels. A small ripple persists on secondary rectified current for a few more milliseconds. The resilience the system shows against a dramatic phase shift suggests a smaller, more gradual phase shift would be inconsequential. The response of the synchronous inverter is dynamic enough to be responsive to large transients.

TABLE III

| | Power Transferred in Each Test | | |
|---|---|---|---|
| Test | Energy Drawn (J) | Energy Received (J) | Efficiency (%) |
| Control | 2.30 | 2.27 | 98.7 |
| Test 1 | 2.28 | 2.26 | 99.1 |
| Test 2 | 2.27 | 2.25 | 99.1 |

Table III shows the effectiveness of each of the three testing scenarios. The total power drawn from the primary source, total power transmitted to the secondary load, and overall efficiency are reported. Total power transferred is similar for all three tests, although the control test includes losses due to operating the primary inverters the entire test. No semiconductor losses are considered.

As can be seen from the simulated results, the proposed control method transferred power comparably to commonly-practiced synchronous secondary rectification. Additionally, the proposed design demonstrated autonomy of each primary pad and robustness against phase disturbances in the secondary.

The approach to WPT presented here permits a variety of improvements, compared to current technologies. Those advantages are immediately applicable to dynamic WPT scenarios, although certainly not limited to that application.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A synchronous inverter comprising:
a primary inverter comprising switches;
a first primary inductor connected in series with an output of the primary inverter;
a first primary capacitor connected in parallel with the first primary inductor and the primary inverter;
a second primary capacitor;
a primary pad connected in series with the second primary capacitor, the primary pad comprising a primary pad inductance, the second primary capacitor and primary pad connected in parallel with the first primary capacitor, wherein the primary pad wirelessly transmits power to a synchronous secondary inverter; and
a primary current filter configured to:
detect a first primary current comprising a current in the first primary inductor;
control switches in the primary inverter to provide a positive primary inverter voltage across the output of the primary inverter in response to detecting a positive first primary current; and
control the switches in the primary inverter to provide a negative primary inverter voltage across the output of the primary inverter in response to detecting a negative first primary current.

2. The synchronous inverter of claim 1, wherein the controller comprises a primary current filter with an input comprising a signal representative of the first primary current, wherein the controller controls the switches to provide the positive and negative primary inverter voltages based on a polarity of an output of the primary current filter.

3. The synchronous inverter of claim 2, wherein the primary current filter comprises a fourth order filter.

4. The synchronous inverter of claim 2, wherein the controller controls the switches of the primary inverter to provide the positive primary inverter voltage in response to the primary current filter comprising a first polarity and the controller controls the switches of the primary inverter to provide the negative primary inverter voltage in response to the primary current filter comprising a second polarity, the first polarity opposite the second polarity.

5. The synchronous inverter of claim 2, wherein the primary inverter switches at an inverter switching frequency and components of the primary current filter are selected such that the output of the primary current filter is substantially in phase with the first primary current at the inverter switching frequency and the output of the primary current filter is at least 90 degrees out of phase with the first primary current at a primary resonant frequency comprising a resonance formed by the first primary inductor, the first primary capacitor, the second primary capacitor and the primary pad.

6. The synchronous inverter of claim 1, wherein the controller comprises a switching enable circuit that starts switching of switches of the primary inverter in response to the first primary current being above a primary current threshold and disables switching of the switches of the primary inverter in response to the first primary current being below the primary current threshold.

7. The synchronous inverter of claim 6, wherein the primary inverter switches at an inverter switching frequency and wherein the switching enable circuit further comprises a band-pass filter and wherein an output of the band-pass filter enables and disables switching of the switches in the primary inverter and wherein the band-pass filter passes a first primary current signal at the inverter switching frequency and excludes a frequency where a phase of an output of a primary current filter that is filtering a first primary current signal matches a phase of an impedance of the first primary inductor, the first primary capacitor, the second primary capacitor and primary pad from the output of the primary inverter.

8. The synchronous inverter of claim 7, wherein the band-pass filter comprises a digital filter.

9. The synchronous inverter of claim 7, wherein the band-pass filter comprises a first digital filter function multiplied by a sine function squared and summed with a second digital filter function multiplied by a cosine function squared.

10. The synchronous inverter of claim 1, wherein the primary inverter switches at an inverter switching frequency and wherein, at the inverter switching frequency, a magnitude of impedance of the first primary inductor equals a magnitude of impedance of the first primary capacitor and equals a magnitude of impedance of the primary pad minus a magnitude of impedance of the second primary capacitor.

11. The synchronous inverter of claim 10, wherein the synchronous secondary inverter:
   switches at the inverter switching frequency; and
   comprises a first secondary inductor, a first secondary capacitor, a second secondary capacitor and a secondary pad impedance connected a same way as the first primary inductor, the first primary capacitor, the second primary capacitor and the primary pad impedance,
   wherein, at the inverter switching frequency, an impedance of the first secondary inductor equals an impedance of the first secondary capacitor and equals an impedance of the secondary pad minus an impedance of the second secondary capacitor.

12. The synchronous inverter of claim 1, wherein a first connection of the first primary inductor is connected to the output of the primary inverter, a first connection of the first primary capacitor is connected to a second connection of the first primary inductor and a second connection of the first primary capacitor is connected to a common output of the primary inverter, a first connection of the second primary capacitor is connected to the second connection of the first primary inductor, a first connection of the primary pad is connected to a second connection of the second primary capacitor and a second connection of the primary pad is connected to the common output of the primary inverter.

13. The synchronous inverter of claim 1, wherein the primary inverter is configured as an H-bridge with an input connected to a direct current ("DC") bus.

14. The synchronous inverter of claim 1, wherein an input of the primary inverter is connected to a DC bus and further comprising a rectifier that receives power from an alternating current ("AC") source and provides a DC voltage at the DC bus.

15. A synchronous inverter comprising:
   a primary inverter comprising switches that operate at an inverter switching frequency;
   a reactive component network comprising:
      a first primary inductor connected in series an output of the primary inverter;
      a first primary capacitor connected in parallel with the first primary inductor and the primary inverter;
      a second primary capacitor;
      a primary pad connected in series with the second primary capacitor, the primary pad comprising a primary pad inductance, the second primary capacitor and primary pad connected in parallel with the first primary capacitor, wherein the primary pad wirelessly transmits power to a synchronous secondary inverter; and
   a controller comprising:
      a switching enable circuit that starts switching of switches of the primary inverter in response to a first primary current of the first primary inductor being above a primary current threshold and disables switching of the switches of the primary inverter in response to the first primary current being below the primary current threshold; and
      a primary current filter with an input comprising a signal representative of the first primary current,
         wherein the output of the primary current filter controls switches in the primary inverter to provide a positive primary inverter voltage across the output of the primary inverter in response to the output of the primary current filter comprising a polarity indicative of a positive first primary current, and
         wherein the output of the primary current filter controls switches in the primary inverter to provide a negative primary inverter voltage across the output of the primary inverter in response to the output of the primary current filter comprising a polarity indicative of a negative first primary current.

16. The synchronous inverter of claim 15, wherein the primary current filter comprises a fourth order filter.

17. The synchronous inverter of claim 15, wherein components of the primary current filter are selected such that the output of the primary current filter is substantially in phase with the first primary current at the inverter switching frequency and the output of the primary current filter is at least 90 degrees out of phase with the first primary current at a primary resonant frequency comprising a resonance formed by the first primary inductor, the first primary capacitor, the second primary capacitor and the primary pad.

18. The synchronous inverter of claim 15, wherein the switching enable circuit further comprises a band-pass filter and wherein an output of the band-pass filter enables and disables switching of the switches in the primary inverter and wherein the band-pass filter passes a first primary current signal at the inverter switching frequency and excludes a frequency where a phase of an output of a primary current filter that is filtering a first primary current signal matches a phase of an impedance of the first primary inductor, the first primary capacitor, the second primary capacitor and primary pad from the output of the primary inverter.

19. The synchronous inverter of claim 15, wherein the primary inverter switches at an inverter switching frequency and wherein, at the inverter switching frequency, a magnitude of impedance of the first primary inductor equals a magnitude of impedance of the first primary capacitor and equals a magnitude of impedance of the primary pad minus a magnitude of impedance of the second primary capacitor.

20. A system comprising:
   a primary inverter comprising switches;
   a first primary inductor connected in series with an output of the primary inverter;
   a first primary capacitor connected in parallel with the first primary inductor and the primary inverter;
   a second primary capacitor;
   a primary pad connected in series with the second primary capacitor, the primary pad comprising a primary pad inductance, the second primary capacitor and primary pad connected in parallel with the first primary capacitor;
   a primary current filter configured to:
      detect a first primary current comprising a current in the first primary inductor;
      control switches in the primary inverter to provide a positive primary inverter voltage across the output of the primary inverter in response to detecting a positive first primary current; and
      control the switches in the primary inverter to provide a negative primary inverter voltage across the output of the primary inverter in response to detecting a negative first primary current; and
   a synchronous secondary inverter, wherein the primary pad wirelessly transmits power to a secondary pad of the synchronous secondary inverter.

* * * * *